(12) United States Patent
Sumino

(10) Patent No.: US 11,387,332 B2
(45) Date of Patent: Jul. 12, 2022

(54) METHOD FOR MANUFACTURING SEMICONDUCTOR DEVICE

(71) Applicant: Mitsubishi Electric Corporation, Tokyo (JP)

(72) Inventor: Tasuku Sumino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 127 days.

(21) Appl. No.: 16/981,582

(22) PCT Filed: Jun. 27, 2018

(86) PCT No.: PCT/JP2018/024426
§ 371 (c)(1),
(2) Date: Sep. 16, 2020

(87) PCT Pub. No.: WO2020/003420
PCT Pub. Date: Jan. 2, 2020

(65) Prior Publication Data
US 2021/0074818 A1    Mar. 11, 2021

(51) Int. Cl.
| | |
|---|---|
| *H01L 21/00* | (2006.01) |
| *H01L 29/40* | (2006.01) |
| *H01L 21/306* | (2006.01) |
| *H01L 21/308* | (2006.01) |
| *H01L 29/423* | (2006.01) |

(52) U.S. Cl.
CPC ......... *H01L 29/401* (2013.01); *H01L 21/308* (2013.01); *H01L 21/3086* (2013.01); *H01L 21/30604* (2013.01); *H01L 29/42376* (2013.01)

(58) Field of Classification Search
None
See application file for complete search history.

(56) References Cited

U.S. PATENT DOCUMENTS

2003/0162406 A1*  8/2003  Gehoski .............. H01L 21/0272
                                                257/E29.127

FOREIGN PATENT DOCUMENTS

| JP | H10-092845 A | 4/1998 |
|---|---|---|
| JP | H11-126782 A | 5/1999 |

OTHER PUBLICATIONS

International Search Report; Written Opinion; and Notification of Transmittal of the International Search Report and the Written Opinion of the International Searching Authority, or the Declaration issued in PCT/JP2018/024426; dated Aug. 28, 2018.

* cited by examiner

*Primary Examiner* — Reema Patel
(74) *Attorney, Agent, or Firm* — Studebaker & Brackett PC

(57) ABSTRACT

A resist (4) is applied on a semiconductor substrate (1) and a first opening (5) and a second opening (6) whose width is narrower than that of the first opening (5) are formed at the resist (4). The semiconductor substrate (1) is wet-etched using the resist (4) as a mask to form one continuous recess (7) below the first opening (5) and the second opening (6). After forming the recess (7), a shrink material (8) is cross-linked with the resist (4) to block the second opening (6) without blocking the first opening (5). After blocking the second opening (6), a gate electrode (11) is formed within the recess (7) via the first opening (5).

6 Claims, 10 Drawing Sheets

METHOD FOR MANUFACTURING SEMICONDUCTOR DEVICE

FIELD

The present disclosure relates to a method for manufacturing a semiconductor device

BACKGROUND

To meet the requirements for reduction in size and improvement in performance of a semiconductor device, miniaturization of electrodes, wirings, and the like, which constitute the semiconductor device has been promoted. Particularly, in a field of a compound semiconductor, to utilize excellent high-frequency characteristics of materials, it is strongly desired to make a gate electrode thinner. However, if the gate electrode is made thinner, because an electric field concentrates in a narrow region, an adverse effect of miniaturization typified by a short channel effect, or the like, also occurs. As one means for solving this problem, an offset gate structure in which the gate electrode is placed closer to a source electrode side, and an interval from a drain electrode to which a voltage is applied is extended, is effective.

CITATION LIST

Patent Literature

[PTL 1] JP H11-126782 A

SUMMARY

Technical Problem

In related art, patterning of a resist for forming a recess and patterning of a resist for forming a gate electrode have been respectively and separately performed. However, because misalignment occurs between the first patterning and the second patterning, a position of the gate electrode within the recess varies. Therefore, characteristics fluctuate, and yield of products decreases. Further, because it is necessary to perform patterning twice, the number of processes increases, which increases manufacturing cost.

Further, a method in which a recess is formed using a resist at which two large and small openings are formed, and a gate electrode is formed in the recess via the large opening while the small opening is blocked with an insulating film has been also proposed (see, for example, PTL 1). However, when the insulating film is subjected to dry etching, a semiconductor immediately below the gate electrode is damaged. Therefore, there has been a problem that, because carriers decrease and defects and traps increase, reliability degrades.

The present invention has been made to solve the problem as described above, and an object of the present invention is to provide a method for manufacturing a semiconductor device which is capable of improving yield of products and reliability and reducing manufacturing cost.

Solution to Problem

A method for manufacturing a semiconductor device according to the present disclosure includes: applying a resist on a semiconductor substrate and forming a first opening and a second opening whose width is narrower than that of the first opening at the resist; wet-etching the semiconductor substrate using the resist as a mask to form one continuous recess below the first opening and the second opening; after forming the recess, cross-linking a shrink material with the resist to block the second opening without blocking the first opening; and after blocking the second opening, forming a gate electrode within the recess via the first opening.

Advantageous Effects of Invention

In the present disclosure, the semiconductor substrate is wet-etched to form one continuous recess below the first opening and the second opening. Then, the shrink material is cross-linked with the resist and the resist is subjected to pattern shrinking so that the second opening with a narrower width is completely blocked without the first opening whose width is wider being blocked. Then, the gate electrode is formed within the recess in a region where the first opening is formed. By this means, because the position of the gate electrode within the recess does not vary, yield of products is improved. Further, the number of processes of patterning of the resist is reduced, so that it is possible to reduce manufacturing cost. Further, because the semiconductor immediately below the gate electrode is not damaged, reliability is improved.

DESCRIPTION OF EMBODIMENTS

A method for manufacturing a semiconductor device according to the embodiments of the present disclosure will be described with reference to the drawings. The same components will be denoted by the same symbols, and the repeated description thereof may be omitted.

Embodiment 1

Figure 1:
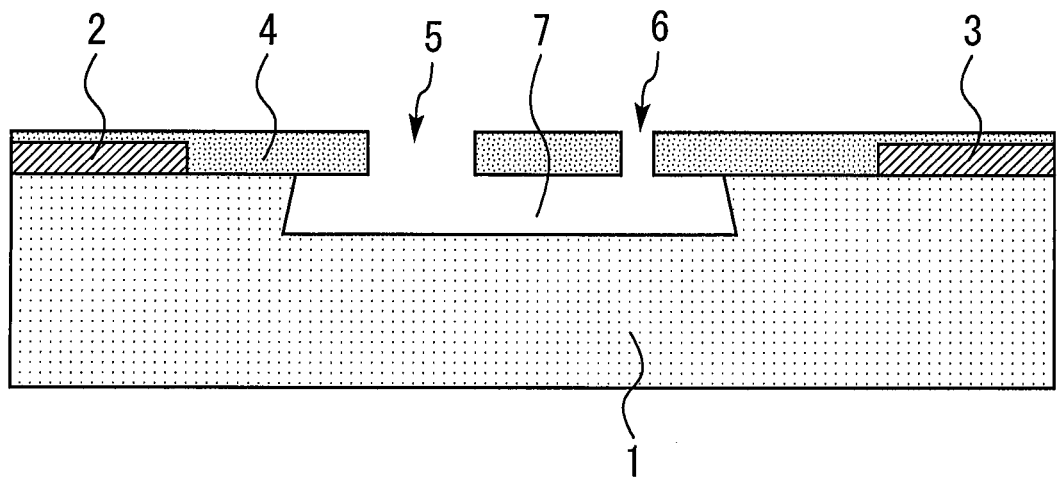
FIG. 1 is a cross-sectional view illustrating a method for manufacturing a semiconductor device according to Embodiment 1.

FIG. 1 to FIG. 4 are cross-sectional views illustrating a method for manufacturing a semiconductor device according to Embodiment 1. First, as illustrated in FIG. 1, a source electrode 2 and a drain electrode 3 are formed on a semiconductor substrate 1. The semiconductor substrate 1 is formed with GaAs, or the like. The source electrode 2 and the drain electrode 3 are formed with Ti/Pt/Au, or the like.

A resist 4 is applied on the semiconductor substrate 1, the source electrode 2 and the drain electrode 3. The resist 4 is, for example, Sumi resist manufactured by Sumitomo Chemical Company, Limited, or the like. A first opening 5 and a second opening 6 whose width is narrower than that of the first opening 5 are formed at the resist 4 through photolithography, or the like. Here, the first opening 5 is formed on the source electrode 2 side, and the second opening 6 is formed on the drain electrode 3 side. The width of the first opening 5 is from 0.2 to 0.6 µm. The width of the second opening 6 is from 0.1 to 0.5 µm. An interval between the first opening 5 and the second opening 6 is from 0.1 to 0.2 µm.

One continuous recess 7 is formed below the first opening 5 and the second opening 6 by the semiconductor substrate 1 being immersed into phosphoric acid or citric acid for several seconds to several minutes and subjected to wet etching using the resist 4 as a mask. The recess 7 is also formed below the resist 4 between the first opening 5 and the second opening 6 as well as below the first opening 5 and the second opening 6 so as to be continuous.

Figure 2:
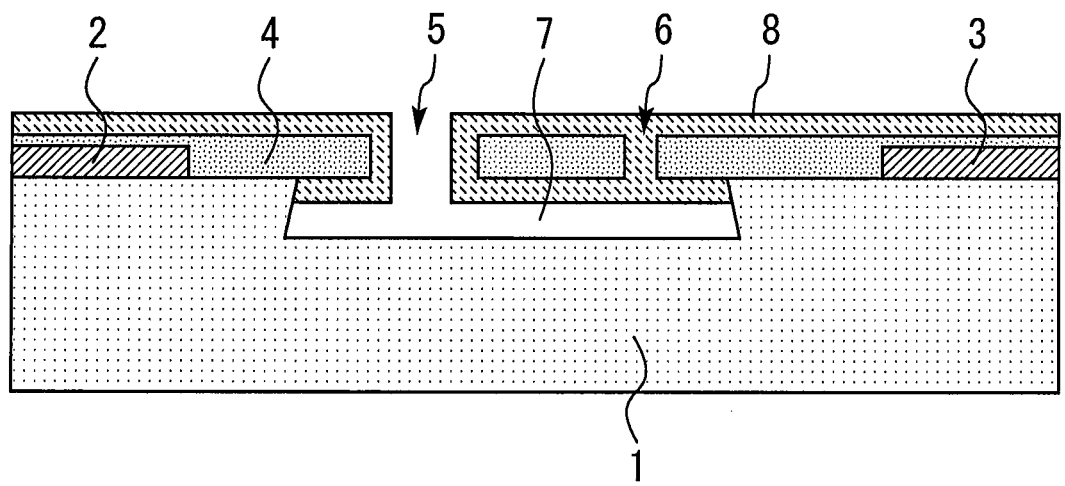
FIG. 2 is a cross-sectional view illustrating a method for manufacturing a semiconductor device according to Embodiment 1.

Then, as illustrated in FIG. 2, a shrink material 8 is applied to the resist 4. The shrink material 8 is RELACS manufactured by AZ Electronic Materials Co., Ltd, or the like. The resist 4 is subjected to pattern shrinking by the shrink material 8 being heated to an appropriate temperature to cross-linking react with the resist 4. By this means, the second opening 6 with a narrower width is completely blocked without the first opening 5 whose width is wider being blocked.

Figure 3:
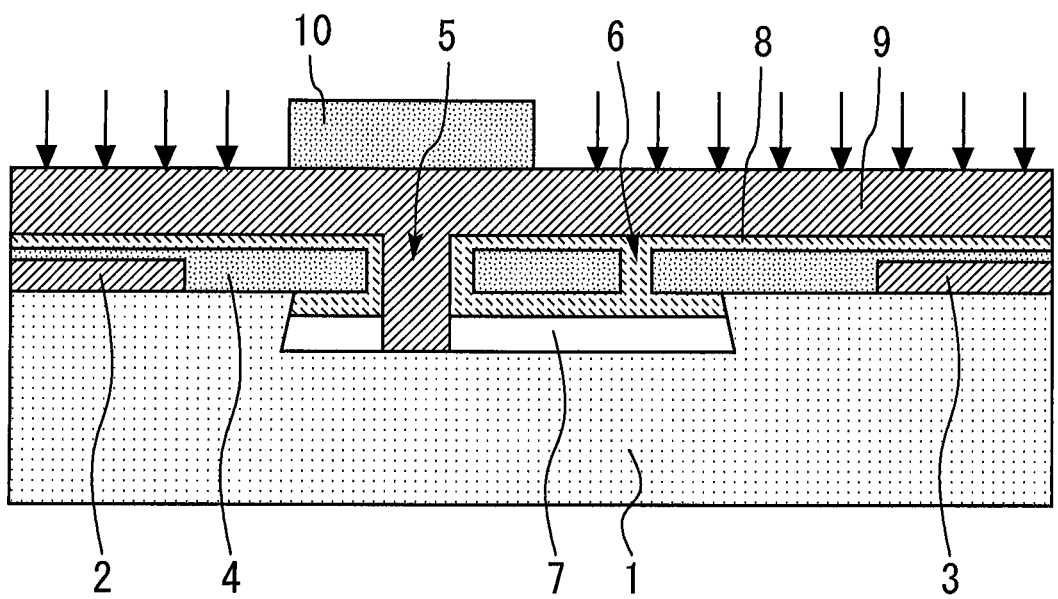
FIG. 3 is a cross-sectional view illustrating a method for manufacturing a semiconductor device according to Embodiment 1.
Figure 4:
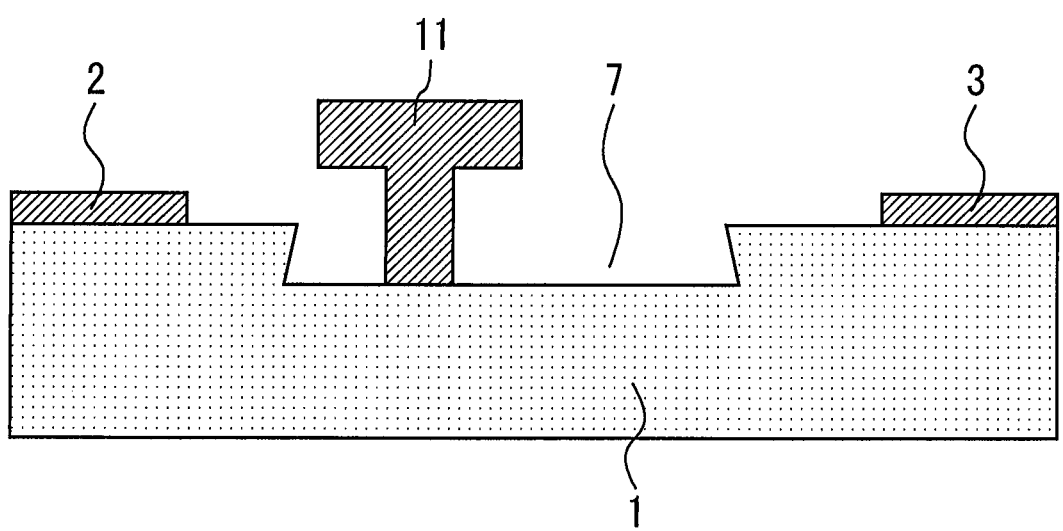
FIG. 4 is a cross-sectional view illustrating a method for manufacturing a semiconductor device according to Embodiment 1.

Then, as illustrated in FIG. 3, a metal film 9 is formed on the entire surface through sputtering or vacuum deposition. The metal film 9 is not only formed on an upper surface of the resist 4 and the shrink material 8, but also reaches a bottom surface of the recess 7 through the first opening 5. A resist 10 is formed on the metal film 9. While the resist 10 is left in a width wider than that of the first opening 5 above the first opening 5, the other resist 10 is removed through photolithography, or the like. Patterning is performed on the metal film 9 through dry etching using the resist 10 as a mask. Thereafter, the resists 4 and 10, and the shrink material 8 are removed. By this means, as illustrated in FIG. 4, a T-shaped gate electrode 11 is formed within the recess 7 at a portion where the first opening 5 is formed. The dry etching is, for example, ion milling, or the like, for several seconds to several ten minutes using Ar gas, or the like. Note that the gate electrode 11 may be formed through a lift-off process.

Figure 5:
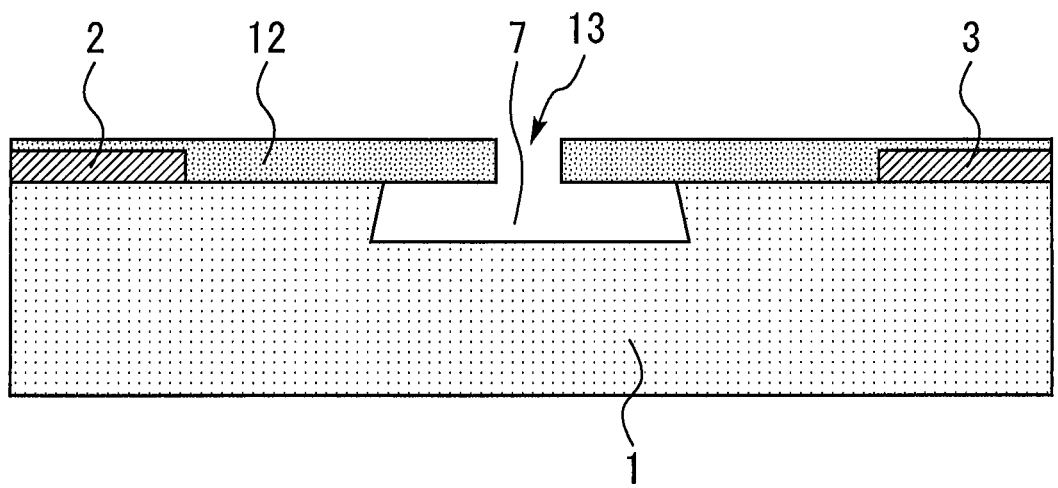
FIG. 5 is a cross-sectional view illustrating a method for manufacturing a semiconductor device according to the comparative example.
Figure 6:
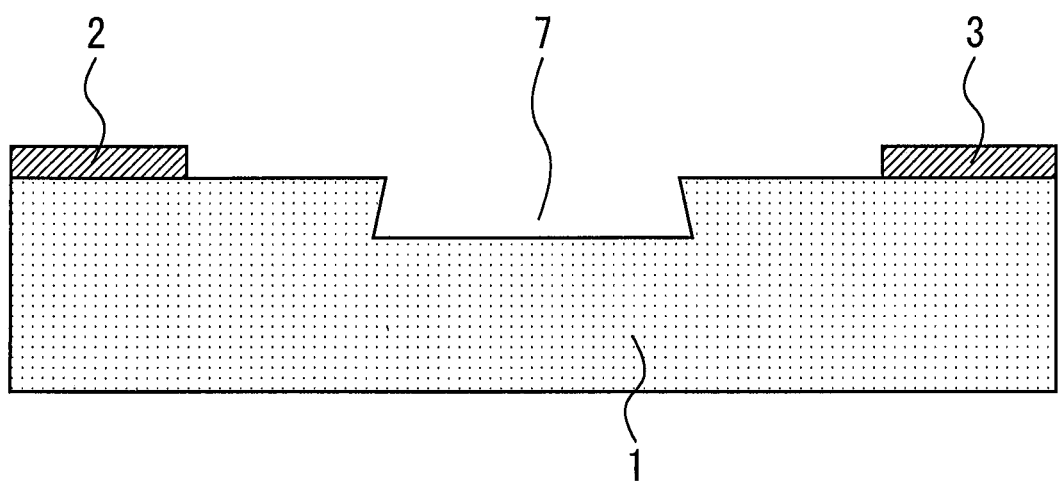
FIG. 6 is a cross-sectional view illustrating a method for manufacturing a semiconductor device according to the comparative example.
Figure 7:
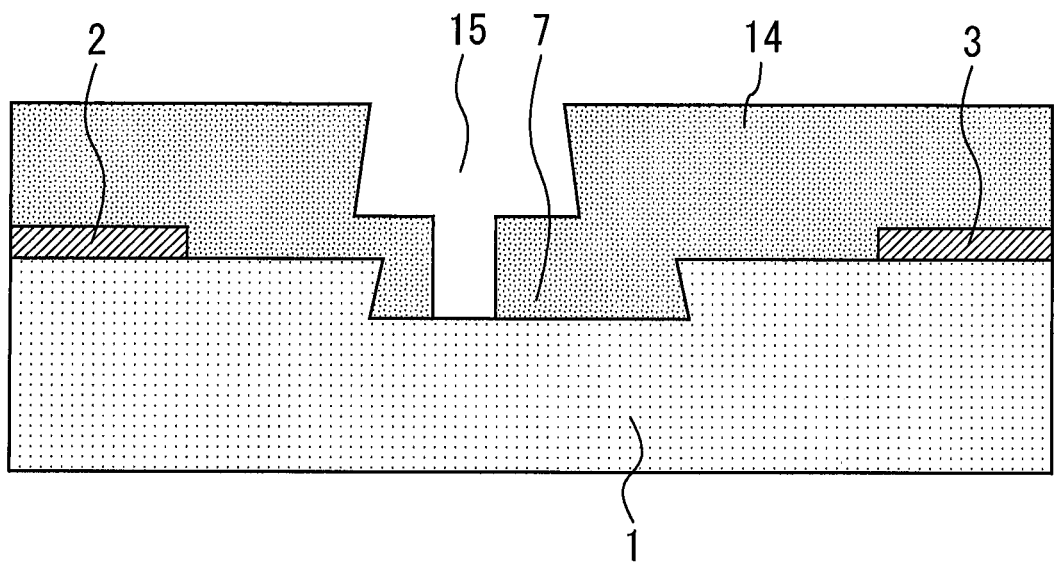
FIG. 7 is a cross-sectional view illustrating a method for manufacturing a semiconductor device according to the comparative example.
Figure 8:
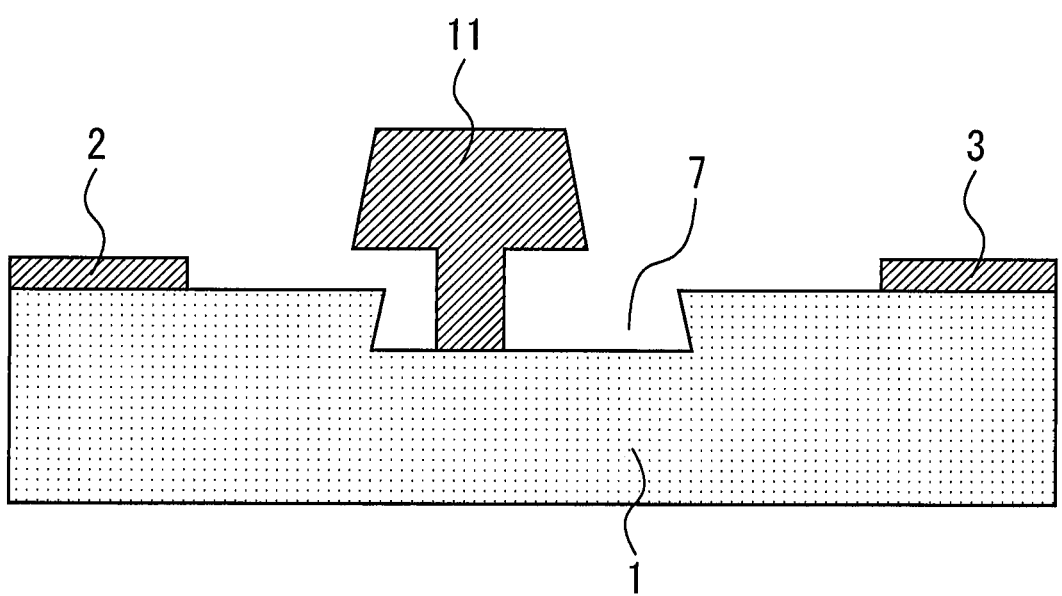
FIG. 8 is a cross-sectional view illustrating a method for manufacturing a semiconductor device according to the comparative example.

Subsequently, effects of the present embodiment will be described through comparison with a comparative example. FIG. 5 to FIG. 8 are cross-sectional views illustrating a method for manufacturing a semiconductor device according to the comparative example. In the comparative example, as illustrated in FIG. 5, only one opening 13 is formed at a resist 12. The recess 7 is formed below the opening 13 by the semiconductor substrate 1 being subjected to wet etching using this resist 12 as a mask. Then, as illustrated in FIG. 6, the resist 12 is removed. Then, as illustrated in FIG. 7, a resist 14 is formed on the entire surface, and an opening 15 is formed at the resist 14 within the recess 7. Then, as illustrated in FIG. 8, the gate electrode 11 is formed within the recess 7 at a portion where the opening 15 is formed. Thereafter, the resist 14 is removed. In the comparative example, because misalignment occurs between the first patterning and the second patterning of the resist, a position of the gate electrode 11 within the recess 7 varies. Therefore, characteristics fluctuate, and yield of products decreases. Further, because it is necessary to perform patterning twice, the number of processes increases, which increases manufacturing cost.

Meanwhile, in the present embodiment, one continuous recess 7 is formed below the first opening 5 and the second opening 6 of the resist 4 by the semiconductor substrate 1 being subjected to wet etching. Then, the resist 4 is subjected to pattern shrinking by the shrink material 8 being caused to cross-linking react with the resist 4, and the second opening 6 whose width is narrower is completely blocked without the first opening 5 whose width is wider being blocked. Then, the gate electrode 11 is formed within the recess 7 in a region where the first opening 5 is formed. By this means, because the position of the gate electrode 11 within the recess 7 does not vary, yield of products is improved. Further, the number of processes of patterning of the resist is reduced, so that it is possible to reduce manufacturing cost. Further, because the semiconductor immediately below the gate electrode 11 is not damaged, reliability is improved.

Further, the first opening 5 is formed on the source electrode 2 side, and the second opening 6 is formed on the drain electrode 3 side. By this means, it is possible to realize an offset gate structure in which the gate electrode 11 is placed closer to the source electrode 2 side, so that it is possible to improve high-frequency characteristics. Further, after the gate electrode 11 is formed, the resist 4 and the shrink material 8 are removed. By this means, because gate capacitance is reduced, high-frequency characteristics are improved.

Embodiment 2

Figure 9:
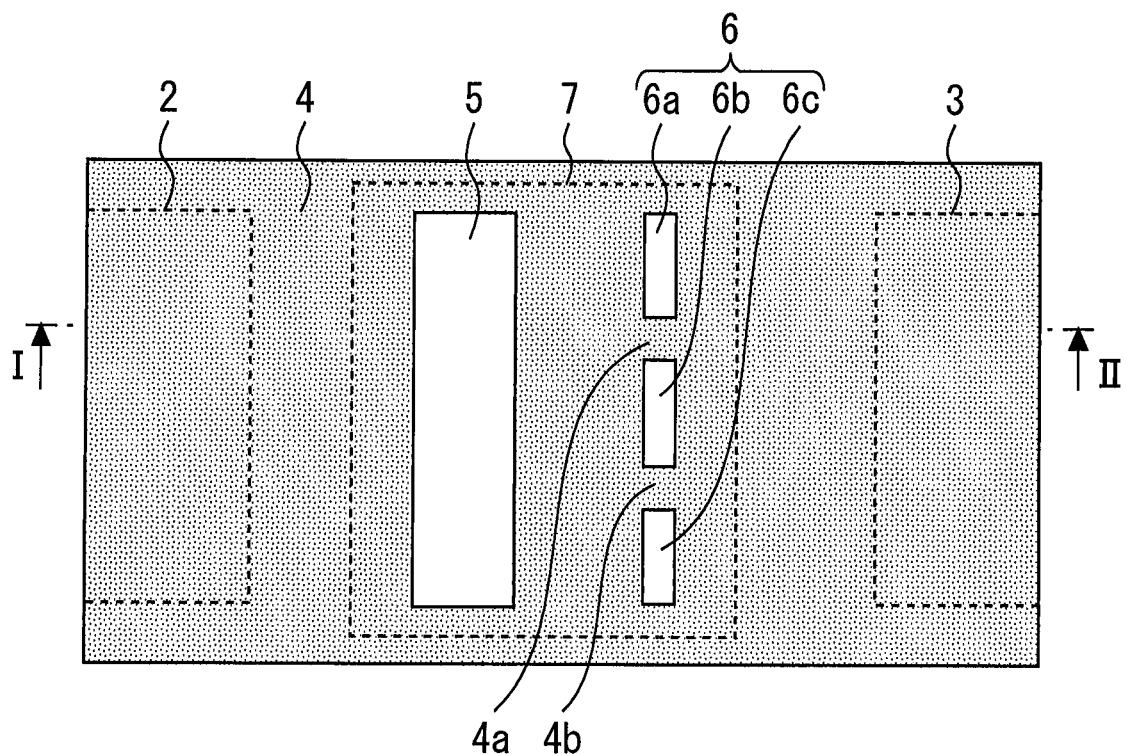
FIG. 9 is a plan view illustrating a first opening and a second opening of a resist according to Embodiment 2.
Figure 10:
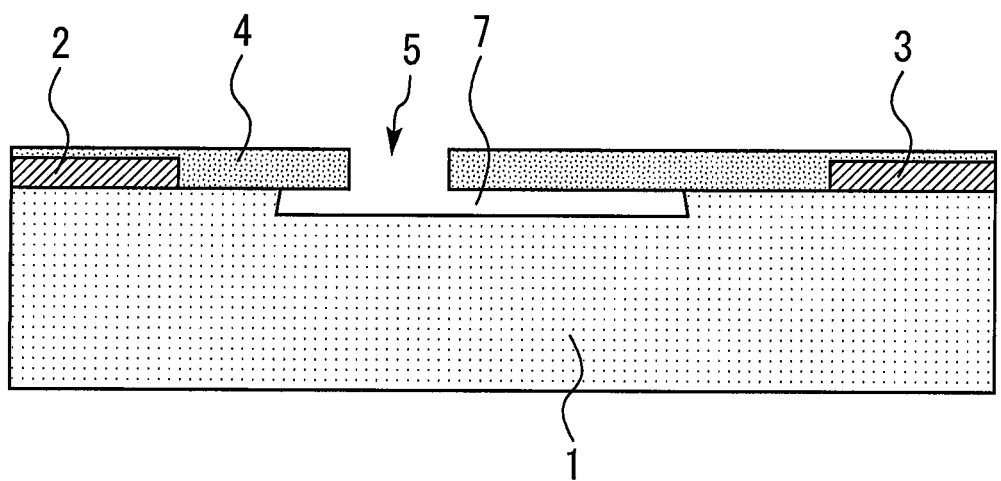
FIG. 10 is a cross-sectional view along I-II in FIG. 9.

FIG. 9 is a plan view illustrating a first opening and a second opening of a resist according to Embodiment 2. FIG.

10 is a cross-sectional view along I-II in FIG. 9. The second opening 6 includes a plurality of openings 6a, 6b and 6c which are separate from one another. Between the openings 6a and 6b and between the openings 6b and 6c, portions 4a and 4b which are not open exist.

Figure 11:
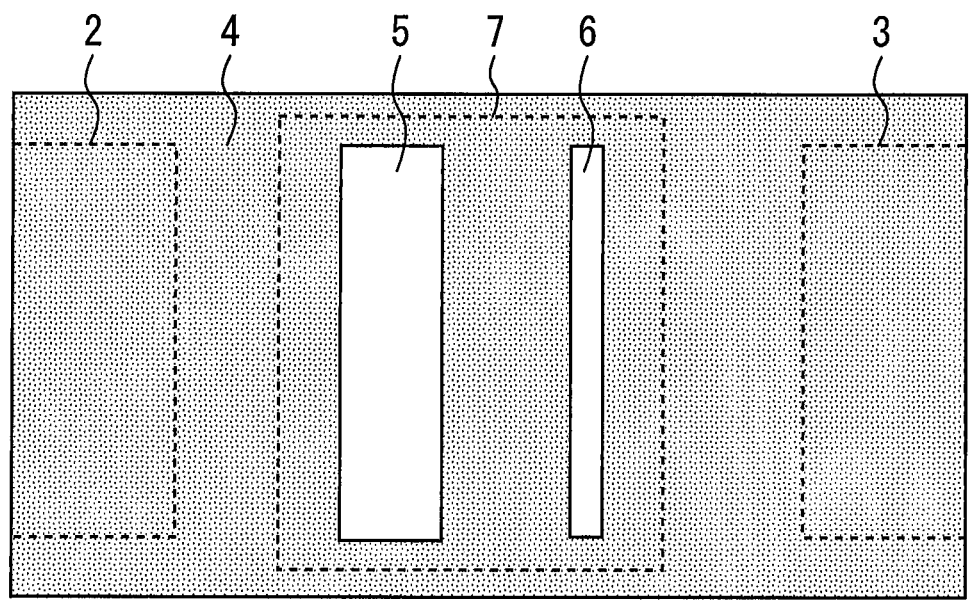
FIG. 11 is a plan view illustrating the first opening and the second opening of the resist according to Embodiment 1.

Subsequently, effects of the present embodiment will be described through comparison with those of Embodiment 1. FIG. 11 is a plan view illustrating the first opening and the second opening of the resist according to Embodiment 1. In Embodiment 1, the second opening 6 is one elongated opening. Therefore, if an interval between the first opening 5 and the second opening 6 is narrow, there is a possibility that the resist 4 between the first opening 5 and the second opening 6 may collapse. Meanwhile, in the present embodiment, because portions 4a and 4b which are not open exist between the openings 6a and 6b, and between the openings 6b and 6c, it is possible to reinforce the resist 4. By this means, it is possible to realize stable pattern formation, so that yield of products is improved. Other configurations and effects are similar to those in Embodiment 1.

Embodiment 3

Figure 12:
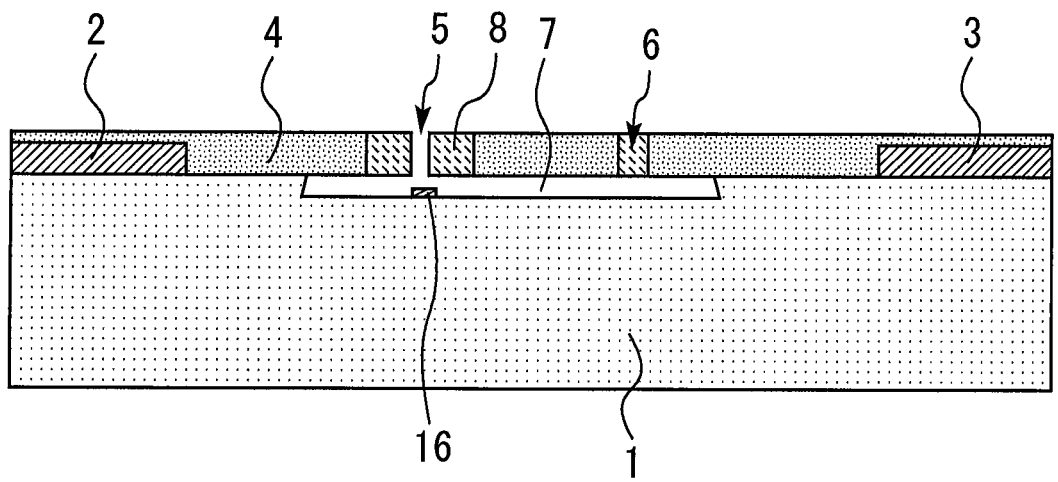
FIG. 12 is a cross-sectional view illustrating a method for manufacturing a semiconductor device according to Embodiment 3.
Figure 13:
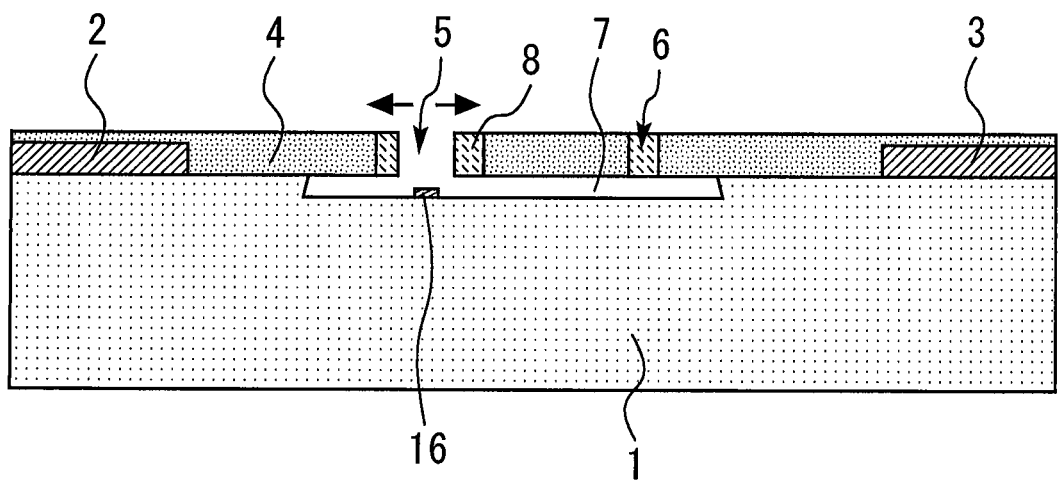
FIG. 13 is a cross-sectional view illustrating a method for manufacturing a semiconductor device according to Embodiment 3.

FIG. 12 to FIG. 15 are cross-sectional views illustrating a method for manufacturing a semiconductor device according to Embodiment 3. Processes until processes of forming the recess and causing the shrink material 8 to cross-linking react with the resist 4 are similar to those in Embodiment 1. Then, as illustrated in FIG. 12, a thin Pt film 16 is formed on a bottom surface of the recess 7 via the first opening 5 through sputtering or vapor deposition. Then, as illustrated in FIG. 13, an opening width of the first opening 5 is slightly extended through ashing.

Figure 14:
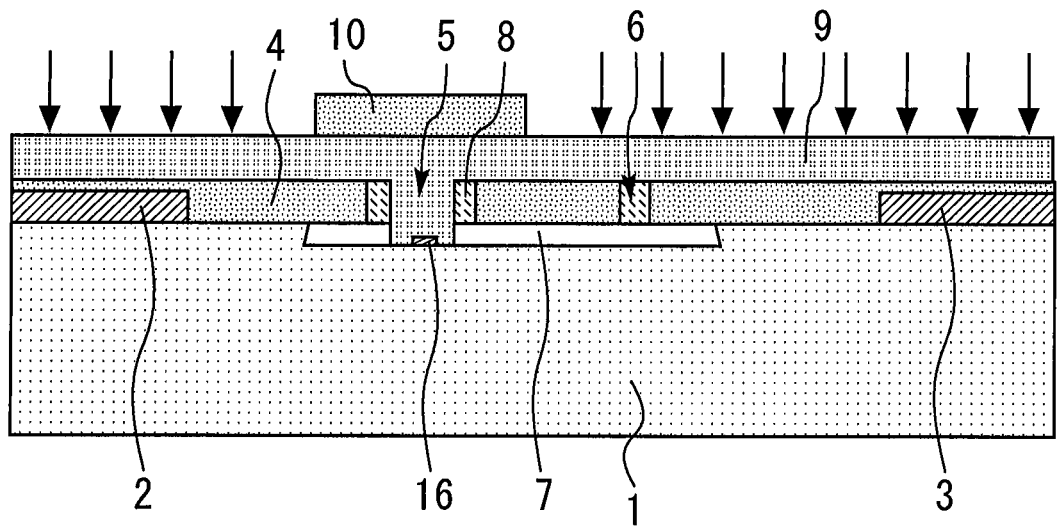
FIG. 14 is a cross-sectional view illustrating a method for manufacturing a semiconductor device according to Embodiment 3.

Then, as illustrated in FIG. 14, the metal film 9 which reaches the bottom surface of the recess 7 via the first opening 5 whose opening width is extended is formed through sputtering or vapor deposition. In a similar manner to Embodiment 1, the metal film 9 is patterned through dry etching using the resist 10 as a mask. The metal film 9 is formed with a metal different from the Pt film 16. Thereafter, the resist 4 and the shrink material 8 are removed.

Figure 15:
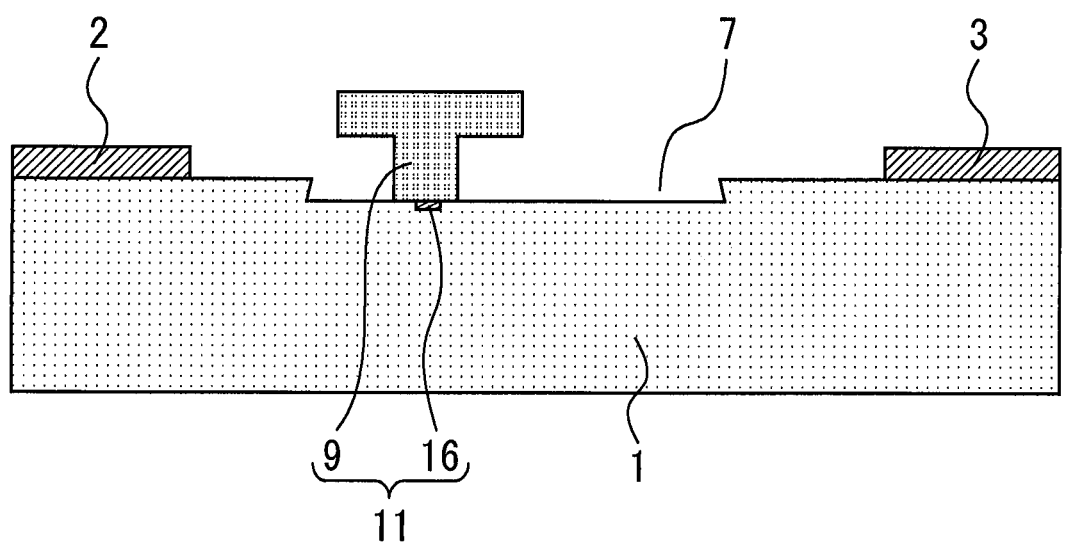
FIG. 15 is a cross-sectional view illustrating a method for manufacturing a semiconductor device according to Embodiment 3.

Then, as illustrated in FIG. 15, the Pt film 16 is sunk into the semiconductor substrate 1 by the semiconductor substrate 1 being caused to react with the Pt film 16 through heat treatment. The gate electrode 11 includes the Pt film 16 sunk into the semiconductor substrate 1, and the metal film 9 which is formed with a metal different from the Pt film 16, which has a width wider than that of the Pt film 16 and which overlaps on the Pt film 16.

Typically, in a transistor, an electric field concentrates at a lower end portion on a drain side of a gate electrode. In contrast, in the present embodiment, a lower end portion of the gate electrode 11 at which an electric field is likely to concentrate has a step shape. Therefore, it is possible to disperse portions where electric field strength concentrates. Accordingly, a short channel effect is suppressed while effects of an offset gate are provided, so that high-frequency characteristics are improved.

Further, after the Pt film 16 is formed via the first opening 5, the metal film 9 is formed via the first opening 5 whose opening width is extended through ashing, and the Pt film 16 is sunk into the semiconductor substrate 1 through heat treatment. By this means, it is possible to easily form the gate electrode 11 having a step-shaped lower end portion.

Embodiment 4

Figure 16:
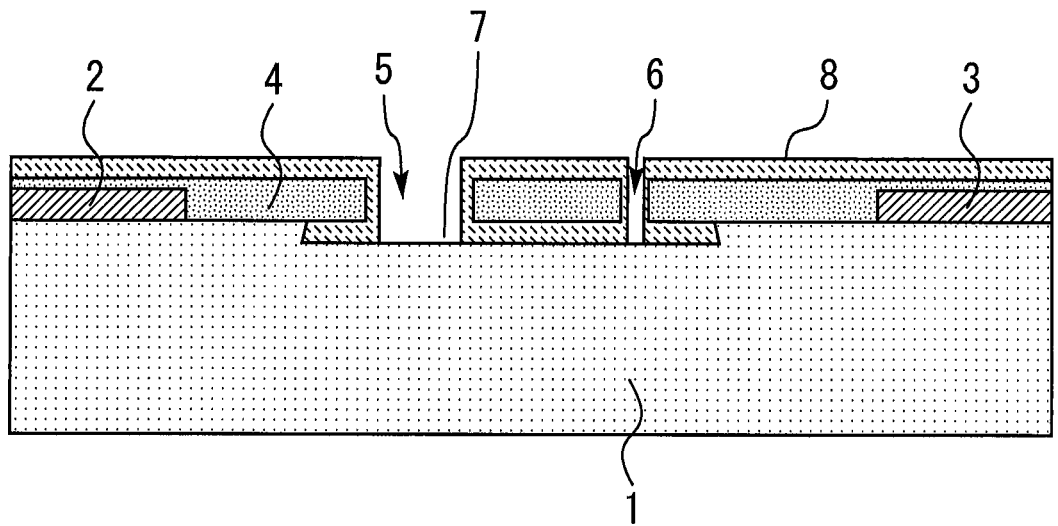
FIG. 16 is a cross-sectional view illustrating a method for manufacturing a semiconductor device according to Embodiment 4.

FIG. 16 to FIG. 19 are cross-sectional views illustrating a method for manufacturing a semiconductor device according to Embodiment 4. Processes until a process of forming the recess 7 are similar to those in Embodiment 1. Then, as illustrated in FIG. 16, by the shrink material 8 being caused to cross-linking react with the resist 4, pattern shrinking is performed until the shrink material 8 reaches the bottom surface of the recess 7.

Figure 17:
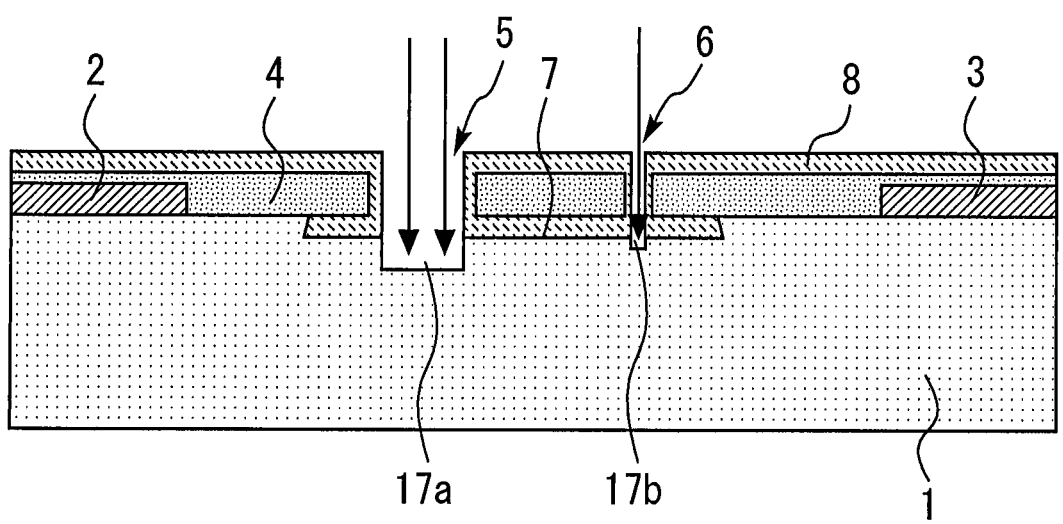
FIG. 17 is a cross-sectional view illustrating a method for manufacturing a semiconductor device according to Embodiment 4.

Then, as illustrated in FIG. 17, a first concave portion 17a is formed below the first opening 5 and a second concave portion 17b is formed below the second opening 6 by etching the bottom surface of the recess 7 using the resist 4 and the shrink material 8 as a mask. Here, because the shrink material 8 reaches the bottom surface of the recess 7, only portions of the first opening 5 and the second opening 6 are subjected to etching. Further, because an etching rate depends on an opening dimension of the pattern, a depth of the first concave portion 17a becomes deeper than a depth of the second concave portion 17b.

Figure 18:
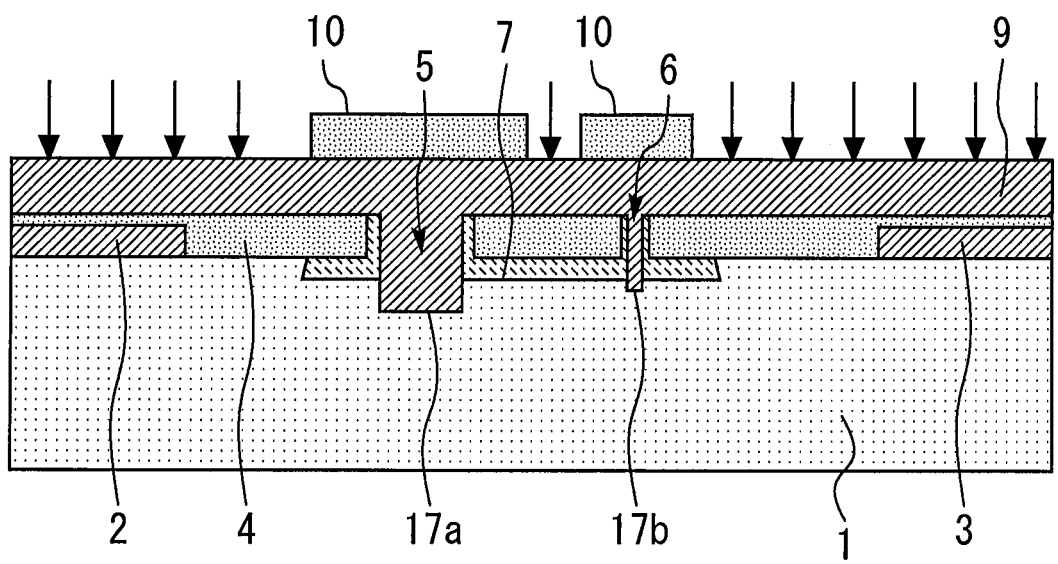
FIG. 18 is a cross-sectional view illustrating a method for manufacturing a semiconductor device according to Embodiment 4.
Figure 19:
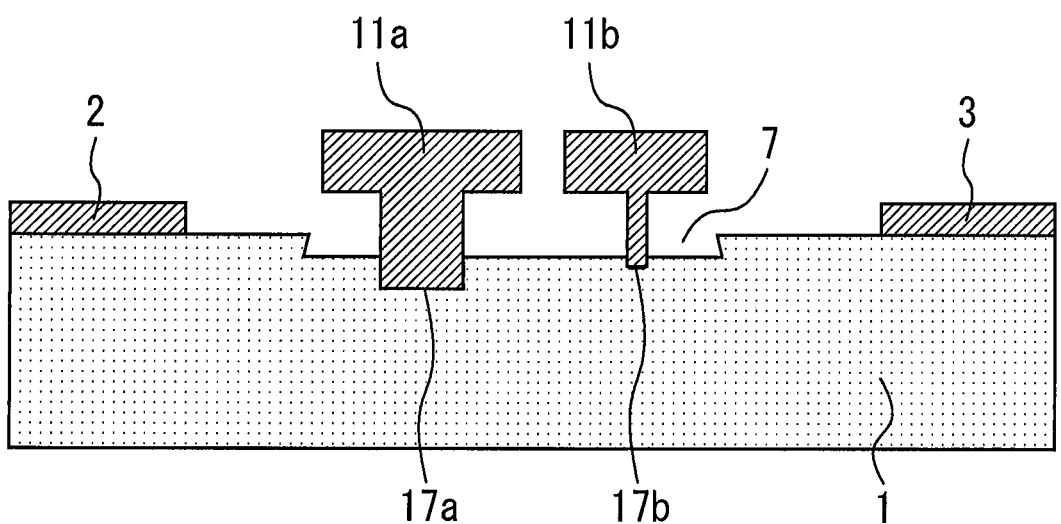
FIG. 19 is a cross-sectional view illustrating a method for manufacturing a semiconductor device according to Embodiment 4.

Then, as illustrated in FIG. 18, the metal film 9 is formed on the entire surface through sputtering or vacuum deposition. The metal film 9 is not only formed on an upper surface of the resist 4 and the shrink material 8, but also reaches the first concave portion 17a and the second concave portion 17b respectively via the first opening 5 and the second opening 6. The metal film 9 is patterned through dry etching using the resist 12 as a mask. Thereafter, the resists 4 and 10 and the shrink material 8 are removed. By this means, as illustrated in FIG. 19, a T-shaped first gate electrode 11a is formed at the first concave portion 17a via the first opening 5, and a T-shaped second gate electrode 11b is formed at the second concave portion 17b via the second opening 6. Note that the first gate electrode 11a and the second gate electrode 11b may be formed through a lift-off process.

As described above, because the depth of the first concave portion 17a is different from the depth of the second concave portion 17b, a threshold of the first gate electrode 11a formed at the first concave portion 17a is different from a threshold of the second gate electrode 11b formed at the second concave portion 17b. Therefore, it is possible to form a transistor having different threshold voltages within the same recess. Further, because positions of the first gate electrode 11a and the second gate electrode 11b within the recess 7 do not vary in a similar manner to Embodiment 1, yield of products is improved. Further, the number of processes of patterning of the resist is reduced, so that it is possible to reduce manufacturing cost.

REFERENCE SIGNS LIST 1 semiconductor substrate; 2 source electrode; 3 drain electrode; 4 resist; 5 first opening; 6 second opening; 6a,6b,6c a plurality of openings; 7 recess; 8 shrink material; 9 metal film; 11 gate electrode; 11a first gate electrode; 11b second gate electrode; 16 Pt film (metal thin film); 17a first recess; 17b second recess

The invention claimed is:
1. A method for manufacturing a semiconductor device comprising:
   applying a resist on a semiconductor substrate and forming a first opening and a second opening whose width is narrower than that of the first opening at the resist;
   wet-etching the semiconductor substrate using the resist as a mask to form one continuous recess below the first opening and the second opening;
   after forming the recess, cross-linking a shrink material with the resist to block the second opening without blocking the first opening; and after blocking the second opening, forming a gate electrode within the recess via the first opening.

2. The method for manufacturing a semiconductor device according to claim 1, further comprising forming a source electrode and a drain electrode on the semiconductor substrate,
wherein the first opening is formed on the source electrode side, and the second opening is formed on the drain electrode side.

3. The method for manufacturing a semiconductor device according to claim 1, further comprising, after forming the gate electrode, removing the resist and the shrink material.

4. The method for manufacturing a semiconductor device according to claim 1, wherein the second opening includes a plurality of openings separate from one another.

5. The method for manufacturing a semiconductor device according to claim 1, wherein the gate electrode includes a metal thin film sunk into the semiconductor substrate, and a metal film formed with a metal different from the metal thin film, having a width wider than that of the metal thin film and overlapping on the metal thin film, and
a lower end portion of the gate electrode has a step shape.

6. The method for manufacturing a semiconductor device according to claim 5, comprising:
after blocking the second opening, forming the metal thin film on a bottom surface of the recess via the first opening;
after forming the metal thin film, extending an opening width of the first opening through ashing;
forming the metal film which reaches a bottom surface of the recess via the first opening whose opening width is extended; and
sinking the metal thin film into the semiconductor substrate by the semiconductor substrate being caused to react with the metal thin film through heat treatment.

* * * * *